(12) United States Patent
Nakagawa (10) Patent No.: US 9,110,112 B2
(45) Date of Patent: Aug. 18, 2015

(54) OCCUPANT SENSOR DEVICE

(71) Applicant: DENSO CORPORATION, Kariya, Aichi-pref. (JP)

(72) Inventor: Hajime Nakagawa, Nagoya (JP)

(73) Assignee: DENSO CORPORATION, Kariya (JP)

( * ) Notice: Subject to any disclaimer, the term of this patent is extended or adjusted under 35 U.S.C. 154(b) by 73 days.

(21) Appl. No.: 13/783,694

(22) Filed: Mar. 4, 2013

(65) Prior Publication Data

US 2013/0234735 A1    Sep. 12, 2013

(30) Foreign Application Priority Data

Mar. 12, 2012 (JP) ................................. 2012-055011

(51) Int. Cl.
| | |
|---|---|
| *G01R 27/26* | (2006.01) |
| *G08B 13/26* | (2006.01) |
| *B60R 21/015* | (2006.01) |

(52) U.S. Cl.
CPC ...... *G01R 27/2605* (2013.01); *B60R 21/01532* (2013.01); *G01R 27/26* (2013.01); *G08B 13/26* (2013.01)

(58) Field of Classification Search
CPC .... G01R 27/2605; G01R 27/26; B60R 21/32; B60R 21/01532; G08B 13/26
USPC ................. 324/688, 686; 340/438, 667, 561, 340/425.5, 573.1, 573.7; 280/735, 730.1, 280/730.2, 728.1; 296/65, 68.1; 73/779; 180/268, 271–273
See application file for complete search history.

(56) References Cited

U.S. PATENT DOCUMENTS

| | | | |
|---|---|---|---|
| 6,356,194 B1 | 3/2002 | Fukui et al. | |
| 7,880,481 B2 * | 2/2011 | Zangl et al. | 324/684 |
| 2006/0005630 A1 | 1/2006 | Jitsui et al. | |
| 2010/0301880 A1 * | 12/2010 | Stanley et al. | 324/686 |
| 2010/0315101 A1 * | 12/2010 | Yamanaka et al. | 324/679 |
| 2011/0074447 A1 * | 3/2011 | Ootaka | 324/679 |
| 2011/0313622 A1 * | 12/2011 | Togura et al. | 701/45 |

FOREIGN PATENT DOCUMENTS

| | | |
|---|---|---|
| JP | 11-271463 | 10/1999 |
| JP | 2000-038077 | 2/2000 |
| JP | 2006-010490 | 1/2006 |

OTHER PUBLICATIONS

Office action dated Feb. 6, 2014 in corresponding Japanese Application No. 2012-055011.

* cited by examiner

*Primary Examiner* — Melissa Koval
*Assistant Examiner* — Felicia Farrow
(74) *Attorney, Agent, or Firm* — Harness, Dickey & Pierce, PLC (57) ABSTRACT

An occupant sensor device includes a sensor body unit disposed in a base part of a seat in a vehicle, and an occupant detection device. The sensor body unit is divided into at least two parts, such as a first sensor part and a second sensor part, where the first sensor part is positioned in front of the second sensor part. Based on a capacitance between the sensor body unit and a vehicle body, the occupant detection device detects an occupant type of an occupant that is seated on the seat. In particular, the occupant detection unit is able to detect the occupant type based on a first capacitance provided by the first sensor part, a second capacitance provided by the second sensor part, and a total capacitance, which is a total of the first capacitance and the second capacitance.

9 Claims, 7 Drawing Sheets

OCCUPANT SENSOR DEVICE

CROSS-REFERENCE TO RELATED APPLICATION

This application is based on and claims the benefit of priority of Japanese Patent Application No. 2012-55011 filed on Mar. 12, 2012, the disclosure of which is incorporated herein by reference.

TECHNICAL FIELD

The present disclosure generally relates to an occupant sensor device, which uses capacitance to determine a type of occupant seated in a seat.

BACKGROUND

The occupant sensor device that uses capacitance may include, for example, a capacitance type sensor and an occupant detection electronic control unit (hereinafter "ECU"). The capacitance type sensor is a device that outputs, either as an electric current or a voltage, a change in a weak electric field that is generated between a main electrode disposed in a seat and a vehicle body. The occupant detection ECU distinguishes whether an occupant is seated and what type of occupant is seated. In particular, whether an adult, a child on a child seat (i.e., a child restraint system: CRS) or other objects is seated is determined based on the change of the capacitance. Such an occupant sensor device that uses capacitance is described in Japanese Patent Laid-Open No. H11-271463.

In a course of such determination, many irregular cases are observed. For instance, when an adult with small stature sits only on a front portion of the seat (i.e., having "a front-side sitting" posture), or when an adult sits on one side (i.e., on the right/left side) of the seat (i.e., having "a sideway sitting" posture), the output value of the capacitance from the capacitance type sensor decreases.

Therefore, a difference between a capacitance output of the front-side sitting or the sideway sitting of a small stature adult and a capacitance output of a child (i.e., an infant) sitting on CRS may be very small. As a result, the distinction between a smaller stature adult and a CRS-cradled infant may be very difficult to make.

SUMMARY

In an aspect of the present disclosure, an occupant sensor device disposed in a vehicle, uses capacitance to determine an occupant in a seat. The occupant sensor device includes a sensor body unit and an occupant detection device.

The sensor body unit is disposed in a base part of the seat, and is divided into at least two parts along at least one of two axes. For instance, a first sensor part and a second sensor part of the sensor body unit are divided along an axis, such that the first sensor part is arranged in front of the second sensor.

The occupant detection device detects an occupant type of an occupant seated on the seat based on a capacitance between the sensor body unit and a vehicle body. Specifically, the occupant detection unit detects the occupant type based on a first capacitance, a second capacitance, and a total capacitance, which is a total of the first capacitance and the second capacitance. The first capacitance is a capacitance between the first sensor part and the vehicle body, and the second capacitance is a capacitance between the second sensor part and the vehicle body.

According to the above configuration, the occupant sensor device is able to detect the occupant not only based on a whole capacitance of the sensor body unit but also on an output of the first sensor part and/or an output of the second sensor part. In particular, the configuration of the sensor body unit allows the occupant sensor device to detect the occupant even when the occupant is taking a biasing sitting posture, which may effect one part of the sensor body unit more than another part of the sensor body unit.

BRIEF DESCRIPTION OF THE DRAWINGS

Other objects, features and advantages of the present disclosure will become more apparent from the following detailed description disposed with reference to the accompanying drawings, in which.

DETAILED DESCRIPTION

An embodiment of the present disclosure is described in the following with reference to the drawings. In the drawings, like parts have like numbers, and those numbers are used in all embodiments.

First Embodiment

A capacitance-type occupant sensor device in the first embodiment is disposed in a base part 91 of a seat 9 in a vehicle, and detects an occupant sitting in the seat 9 and determines an occupant type.

Figure 1:
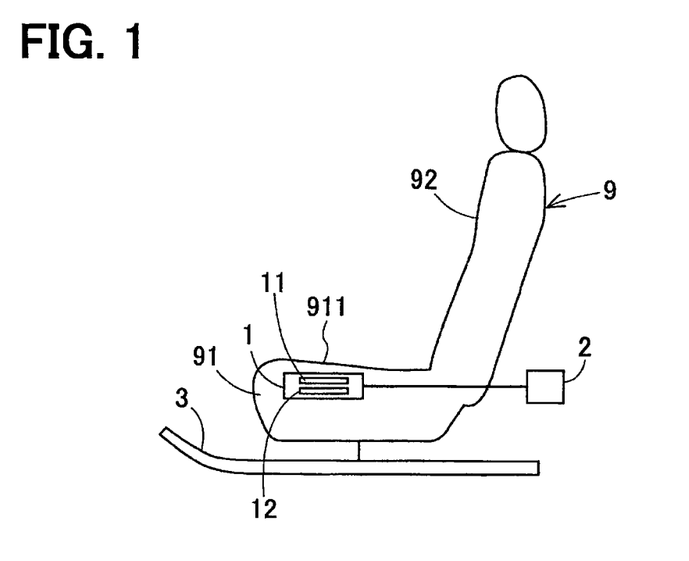
FIG. 1 is an illustration of a capacitance-type occupant sensor device of the present disclosure.

As shown in FIG. 1, the capacitance-type occupant sensor device includes a sensor body unit 1, an occupant detection ECU 2 serving as an occupant detection device, and a vehicle body 3. The sensor body unit 1 is a film-shaped sensor mat, and is disposed in the base part 91 of the seat 9. The seat 9 has the base part 91 and a backrest part 92. The occupant sits on a sitting surface 911 of the base part 91.

Figure 2:
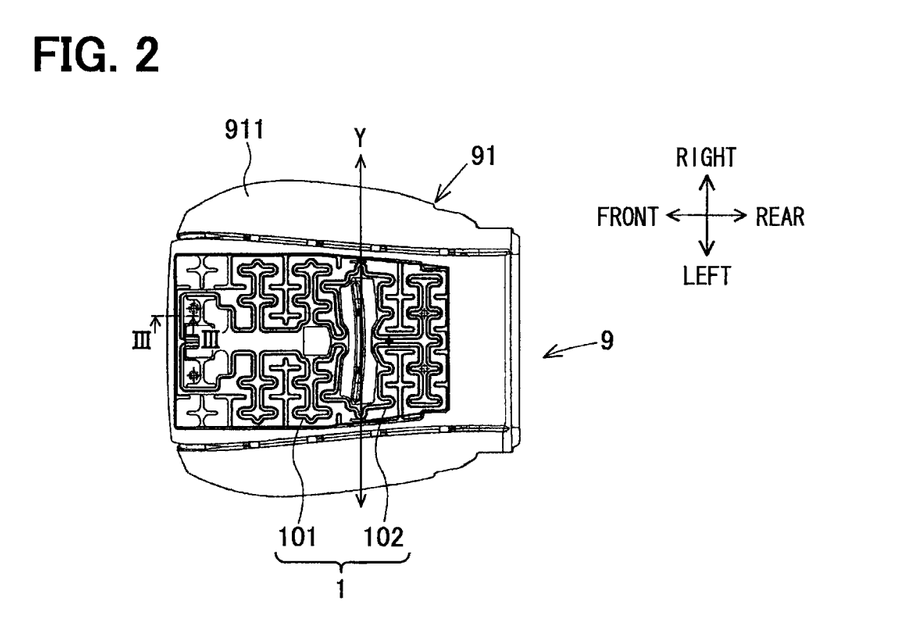
FIG. 2 a top view of a base part of a seat having a sensor body unit in the first embodiment of the present disclosure.

With reference to FIG. 2, the sensor body unit 1 is divided into two parts, a first sensor part 101 and a second sensor part 102, along a Y axis that runs parallel to a right direction and a left direction of the vehicle. The first sensor part 101 is positioned on a portion of the base part 91 facing a front direction of the vehicle and the second sensor unit 102 is arranged on a portion of the base part 91 facing a rear direction of the vehicle. Accordingly, the first sensor part 101 is positioned in front of the second sensor part 102 when viewed in the front direction of the vehicle.

Figure 3:
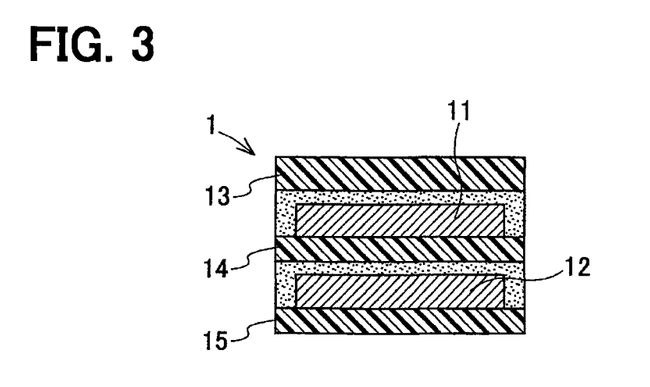
FIG. 3 is a partial cross-sectional view of the sensor body unit of FIG. 2 along line III-III cross section of FIG. 2.
Figure 4:
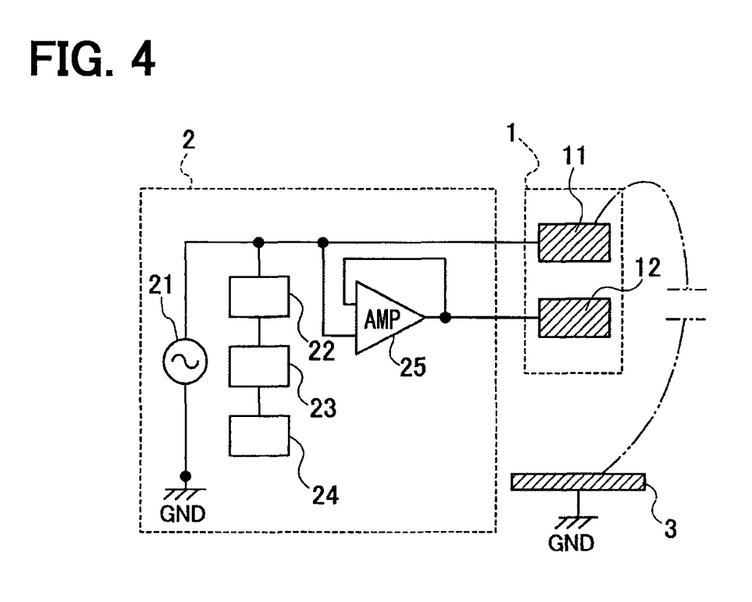
FIG. 4 is a block diagram of a circuit in the capacitance-type occupant sensor device of the present disclosure.

With reference to FIGS. 3 and 4, the first sensor part 101 and the second sensor part 102 include a detection electrode 11, a guard electrode 12, and film members 13, 14, 15. The film members 13, 14, 15 are made of non-conductive material such as polyethylene terephthalate (hereinafter "PET"), and are arranged in an order of 13 to 15 from a top side to a bottom side of the base part 91, (i.e., from the sitting surface 911 to the vehicle body 3). An adhesive is interposed between the film members 13, 14, 15.

The detection electrode 11 has a flat board shape made of conductive material, and the detection electrode 11 is arranged in the shape of a wave in the sensor body unit 1. The detection electrode 11 is bound by the film members 13, 14. The detection electrode 11 is connected to a voltage application part 21 and to an electric current detection part 22. A sub-electrode (not illustrated) may be arranged between the film members 13, 14 for detecting a water spill. The sub-electrode can be arranged next to the detection electrode 11, and has a standard voltage when detecting the water spill, and has the same voltage as the detection electrode 11 when detecting an occupant.

The guard electrode 12 has the same shape as the detection electrode 11, and is disposed on the lower side of the detection electrode 11 with the film member 14 interposed therebetween. The guard electrode 12 is bound by the film members 14, 15. The guard electrode 12 is connected to an op-amp 25.

The occupant detection ECU 2 is an electronic control unit, and includes the voltage application part 21, the electric current detection part 22, a capacity detection part 23, a detection unit 24, and the op-amp 25. The voltage application part 21 is connected to a vehicle's ground GND and to the detection electrode 11. The voltage application part 21 is an AC power supply, and applies, an alternating voltage (i.e., a detection signal) to the detection electrode 11. By having the alternating voltage applied thereto, the detection electrode 11 forms an electric field in a space between the detection electrode 11 and the vehicle body 3 that is grounded to the vehicle ground GND. The electric field formed space may also be designated as a detector-body gap.

The electric current detection part 22 is an electric current sensor, and detects an electric current that is caused by the application of the voltage by the voltage application part 21 and that flows through the detection electrode 11. The capacity detection part 23 is connected to the electric current detection part 22 and to the detection unit 24. The capacity detection part 23 calculates capacitance of the detector-body gap based on the voltage applied by the voltage application part 21 and the electric current detected by the electric current detection part 22. The capacitance can be derived from an imaginary part of the impedance of a route of the electric current including the detector-body gap, and is calculated based on a phase difference between the electric current and the voltage.

The detection unit 24 detects and determines whether an occupant exists and whether the occupant is an adult or a CRS, based on a detection result of the capacity detection part 23 and a predetermined threshold. Details of the detection by the detection unit 24 will be described later. The op-amp 25 is an operational amplifier that has the voltage application part 21 connected to an input side, and has the guard electrode 12 connected to an output side. Further, the op-amp 25 applies the same voltage to the guard electrode 12 as the voltage applied to the detection electrode 11. In such manner, the detection electrode 11 and the guard electrode 12 will have the same voltage. The vehicle body 3 is a body part of the vehicle, and serves as an electrode, and is connected to the vehicle ground GND, which has the standard voltage.

The first sensor part 101 and the second sensor part 102 may be two separate parts. In other words, the sensor parts 101, 102 may be two separate bodies each having the electrodes 11, 12 and the film members 13, 14, 15. Further, in the sensor body unit 1, which includes both the first and second sensor part 101, 102, a portion of the sensor body unit 1 detecting a front capacitance may be considered as the first sensor part 101, and a portion of the sensor body unit 1 detecting a rear capacitance may be considered as the second sensor part 102.

Figure 5:
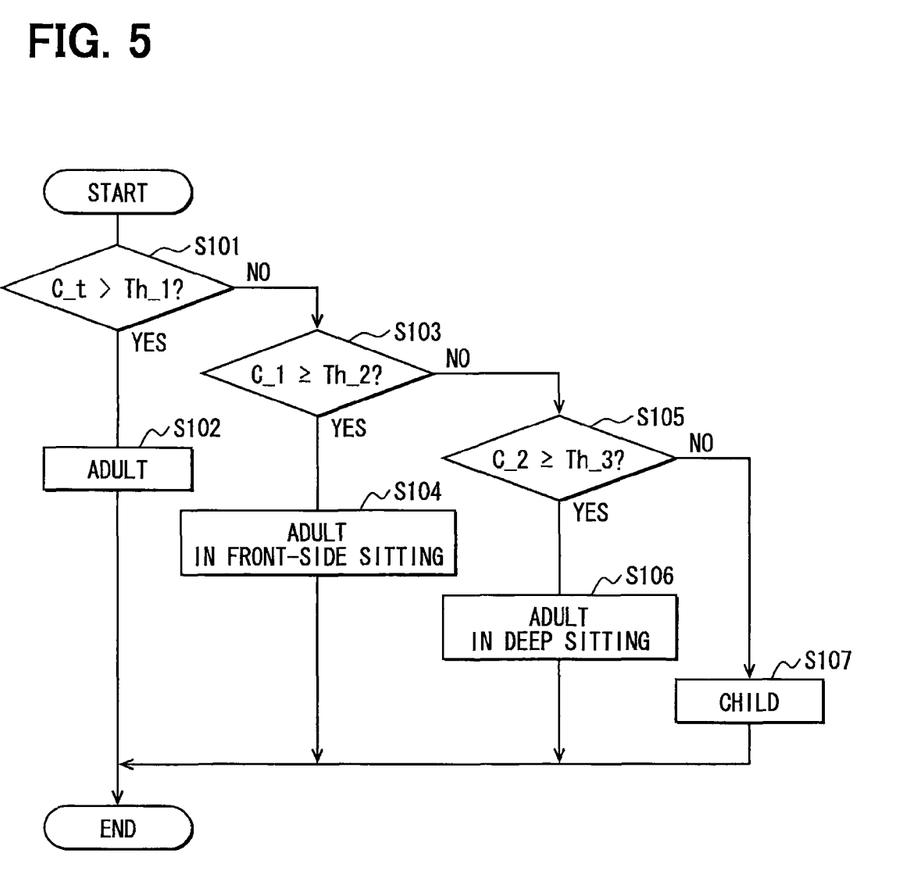
FIG. 5 is a flowchart of an occupant type-determination process performed by a detection unit in the first embodiment of the present disclosure.

In the present embodiment, the film members 13, 14, 15 are respectively provided as having one continuous body, while the first and second electrodes 11, 12 are respectively provided as two separate bodies, i.e., as the first sensor part 101 and as the second sensor part 102. The occupant detection ECU 2 is connected to each of sensor parts 101, 102, and detects the capacitance of each part and a total capacitance of two parts 101, 102. With reference to FIG. 5, an occupant type detection process is now described. The occupant type detection is performed by the detection unit 24 in the first embodiment. The following description is in regards to a case in which an occupant is determined to be present in the seat 9. The following process determines whether the occupant is an adult or not (i.e., non-adult). The "adult" in this case means that the occupant is not an infant, or a small child, in terms of its stature or body size.

First, at S101, the detection unit 24 determines whether a total capacitance $C\_t$ exceeds a first threshold $Th\_1$. The total capacitance $C\_t$ is a total of a first capacitance $C\_1$ and a second capacitance $C\_2$. The first capacitance $C\_1$ is an output of the first sensor part 101, which is a capacitance between the first sensor part 101 and the vehicle body 3, and the second capacitance $C\_2$ is an output of the second sensor part 102, which is a capacitance between the second sensor part 102 and the vehicle body 3. The first threshold $Th\_1$ is a threshold for determining whether an occupant type is an adult or a child (CRS) based on the total capacitance $C\_t$, and is predetermined.

When the total capacitance $C\_t$ exceeds the first threshold $Th\_1$, the detection unit 24 determines that the occupant type is an adult at S102.

On the other hand, when the total capacitance $C\_t$ does not exceed the first threshold $Th\_1$, the detection unit 24 determines whether the first capacitance $C\_1$ is equal to or greater than a second threshold $Th\_2$, which is predetermined, at S103. The second threshold $Th\_2$ is a threshold for determining the posture and the type of the occupant as an adult having a front-side sitting posture based on the first capacitance $C\_1$.

When the first capacitance $C\_1$ is equal to or greater than the second threshold $Th\_2$, the output of the first sensor part 101 on the front portion of the base part 91 of the seat 9 is determined as great, and the detection unit 24 determines, at S104, that the occupant type is an adult having a front-side sitting posture, which may simply be designated as an adult in a front-side sitting posture.

On the other hand, when the first capacitance $C\_1$ is not equal to or greater than the second threshold $Th\_2$ at S103, the detection unit 24 determines, at S105, whether the second capacitance $C\_2$ is equal to or greater than a third threshold $Th\_3$, which is predetermined. The third threshold $Th\_3$ is a threshold for determining the posture and the type of the occupant as an adult having a deep sitting posture based on the second capacitance $C\_2$. The "deep sitting posture" in this case may be, for example, a sitting posture with a back of the thigh not touching the seat 9 and with a knee drawn to oneself. The "deep sitting posture" may also be described as, for example, a sitting posture with the back of one's thigh not touching the seat 9 and with one's hip touching on a rear portion of the base part 91 of the seat 9 and with one's calf touching on a front portion of the base part 91.

When the second capacitance $C\_2$ is equal to or greater than the third threshold $Th\_3$ at S105, the output from the second sensor part 102 of the rear portion of the base part 91 of the seat 9 is great, and the detection unit 24 determines that the occupant type is an adult in a deep sitting posture at S106.

On the other hand, when the second capacitance $C\_2$ is not equal to or greater than the third threshold $Th\_3$ at S105, the detection unit 24 determines that the occupant type is a child (CRS) at S107 (i.e., a non-adult).

In the present embodiment, even when the total capacitance $C\_t$ is small, the occupant sensor device can detect and determine that the occupant type is an adult with one's posture changed (i.e., in a front-side sitting posture or in a deep sitting posture) if the output of the sensor part is great, and does not mistakenly determine that the occupant type is a child (CRS). In particular, if the first capacitance $C\_1$, which is an output of the first sensor part 101 (i.e., front portion sensor part), or the second capacitance $C\_2$, which is an output of the second sensor part 102 (i.e., a rear portion sensor part) is greater than a respective threshold, then an adult is determined to be sitting in the seat 9. Therefore, even when an occupant is changing one's posture on the seat 9, an occupant type and posture can be determined.

Further, the order of performing S103, S104 and the order of performing S105, S106 may be exchanged, or may be performed simultaneously.

In addition, a threshold used to compare to the total capacitance $C\_t$ of the sensor body unit 1, such as the first threshold $Th\_1$, may be referred to as a total threshold in the claims. Similarly, a threshold used to compare a partial capacitance of the sensor body unit 1 (e.g., the first capacitance $C\_1$ and the second capacitance $C\_2$) may be referred to as a partial threshold in the claims. For example, the second threshold $Th\_2$ and the third threshold $Th\_3$ may be referred to as the partial threshold in the claims. The total threshold may be greater than the partial threshold (e.g., $Th\_1 > Th\_2$), and various thresholds that are considered the partial threshold may be the same or may be different (e.g., $Th\_2 = Th\_3$ or $Th\_2 \ne Th\_3$).

Second Embodiment

Figure 6:
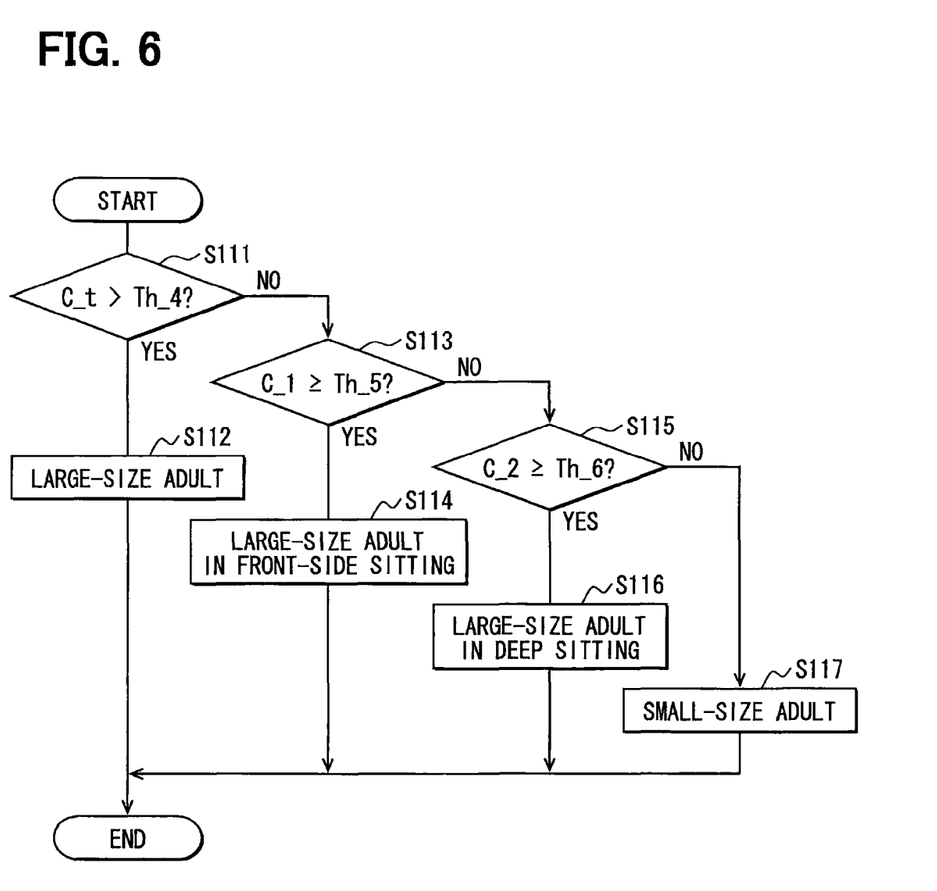
FIG. 6 is a flowchart of an occupant size-determination process performed by the detection unit in a second embodiment of the present disclosure.

With reference to FIG. 6, an occupant size-determination process is shown in a second embodiment. The second embodiment differs from the first embodiment in that the detection unit 24 determines whether a large-size adult (e.g., a male, which can be represented in testing by a AM50 dummy) or a small-size adult (e.g. a female, which can be represented in testing by a AF05 dummy) is sitting in the seat 9. The following description is about a process after the determination that an occupant is an adult.

First, the detection unit 24 determines whether the total capacitance $C\_t$ exceeds a fourth threshold $Th\_4$ at S111. Here, the fourth threshold $Th\_4$ is a threshold for determining whether the occupant type is a large-size adult (e.g., a male) or a small-size adult (e.g., a female) based on the total capacitance $C\_t$, and is predetermined.

When the total capacitance $C\_t$ exceeds the fourth threshold $Th\_4$ at S111, the detection unit 24 determines that the occupant type is a large-size adult at S112.

On the other hand, when the total capacitance $C\_t$ does not exceed the fourth threshold $Th\_4$ at S111, the detection unit 24 determines whether the first capacitance $C\_1$ is equal to or greater than a fifth threshold $Th\_5$, which is predetermined, at S113. Here, the fifth threshold $Th\_5$ is a threshold for determining the posture and the occupant type based on the first capacitance $C\_1$ as a large-size adult in a front-side sitting posture.

When the first capacitance $C\_1$ is equal to or greater than the fifth threshold $Th\_5$, the output from the first sensor part 101 on the front portion of the base part 91 is great, and the detection unit 24 determines that the occupant type is a large-size adult in a front-side sitting posture at S114.

On the other hand, when the first capacitance $C\_1$ is not equal to or greater than the fifth threshold $Th\_5$ at S113, the detection unit 24 determines whether the second capacitance $C\_2$ is equal to or greater than a sixth threshold $Th\_6$, which is predetermined, at S115. Here, the sixth threshold $Th\_6$ is a threshold for determining the posture and the type of the occupant as a large-size adult in a deep sitting posture.

When the second capacitance $C\_2$ is equal to or greater than the sixth threshold $Th\_6$ at S115, the output from the second sensor part 102 on the rear portion of the base part 91 is great, and the detection unit 24 determines that the occupant type is a large-size adult in a deep sitting posture at S116.

On the other hand, when the second capacitance $C\_2$ is not equal to or greater than the sixth threshold $Th\_6$ at S115, the detection unit 24 determines that the occupant type is a small-size adult at S117.

According to the present embodiment, even when the total capacitance $C\_t$ is small, the occupant sensor device can detect and determine that an occupant type is an adult with one's posture changed (i.e., in a front-side sitting or in a deep sitting posture) without mis-determining that the occupant type is a small-size adult. In particular, if the first capacitance $C\_1$ or the second capacitance $C\_2$ is greater than a respective threshold, then an adult is determined to be sitting in the seat 9. Therefore, even when an occupant is changing one's posture on the seat 9, the occupant type and posture can be determined.

Further, an order of performing S113, S114 and an order of performing S115, S116 may be exchanged, or may be performed simultaneously.

Based on the second embodiment, the fourth threshold $Th\_4$, may be referred to as a total threshold in the claims, and the fifth threshold $Th\_5$ and the sixth threshold $Th\_6$ may be referred to as a partial threshold in the claims.

Third Embodiment

Figure 7:
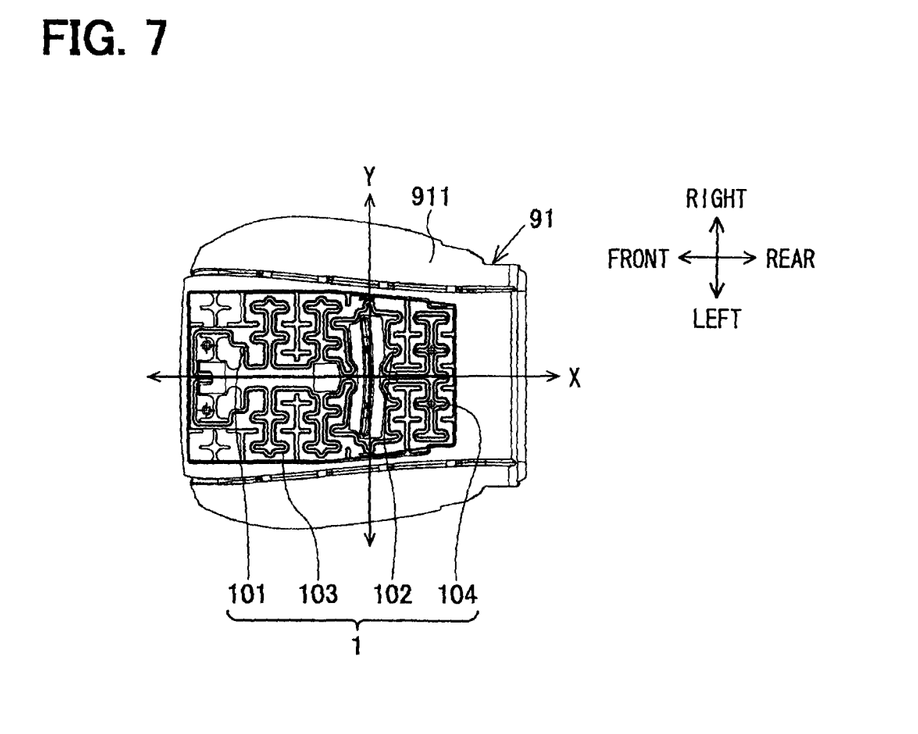
FIG. 7 is a top view of the sensor body unit in a third embodiment of the present disclosure.

The third embodiment of the present disclosure is described with reference to FIGS. 7 and 8. The third embodiment differs from the first embodiment in that the sensor body unit 1 is divided into four parts.

Specifically, the sensor body unit 1 of the present embodiment can be viewed as being divided by an X axis, which that runs parallel with the left and the right directions of the vehicle, and the Y axis, which runs parallel with the front and the rear directions of the vehicle. Accordingly, the sensor body unit 1 is separated into a front-right part, a rear-right part, a front-left part, and a rear-left part, which respectively correspond to the first sensor part 101, the second sensor part 102, a third sensor part 103 and a fourth sensor unit 104.

The first sensor part 101 and the second sensor part 102 are separated along the Y-axis, such that the second sensor part 102 is positioned behind the first sensor part 101 (i.e., positioned towards the rear direction from the Y-axis). Similarly, the third body unit 103 and the fourth sensor part 104 are separated by the Y-axis, such that the fourth sensor part 104 is positioned behind the third sensor part 103 (i.e., positioned towards the rear direction from the Y-axis).

The first sensor part 101 and the third sensor part 103 are separated along the X-axis, such that the third sensor part 103 is positioned on the left side of the first sensor part 101 (i.e., positioned towards the left direction from the X-axis). Similarly, the second sensor part 102 and the fourth sensor part 104 are separated along X-axis, such that the fourth sensor part 104 is positioned on the left side of the second sensor part 102 (i.e., positioned towards the left direction from the first X-axis).

The first to fourth sensor parts 101 to 104 may be formed as separately-provided devices. Alternatively, one sensor body unit 1 may be partially serving as the first to fourth sensor parts 101 to 104. In particular, a front right portion of the unit 1 may serve as the first sensor part 101 for detecting the capacitance of the front right portion of the unit 1; a rear right portion of the unit 1 may serve as the second sensor part 102 for detecting the capacitance of the rear right portion of the unit 1; a front left portion of the unit 1 may serve as the third sensor part 103 for detecting the capacitance of the front left portion of the unit 1; and a rear left portion of the unit 1 may serve as the fourth sensor part 104 for detecting the capacitance of the rear left portion of the unit 1. In the third embodiment, the film members 13 to 15 are respectively provided as having one continuous body, just like the first embodiment.

Figure 8:
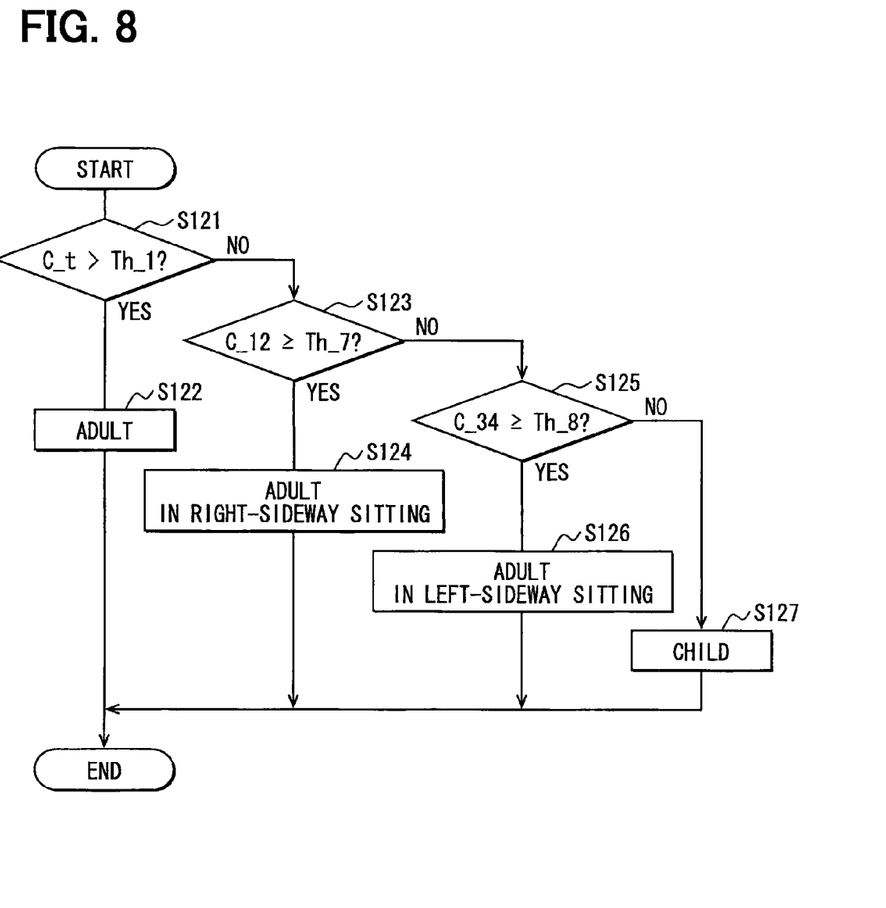
FIG. 8 is a flowchart of an occupant type-determination process performed by the detection unit in the third embodiment of the present disclosure.

With reference to FIG. 8, an occupant type determination process performed by the detection unit 24 of the third embodiment is described. The following description is in regards to a case in which it is determined that an occupant is present in the seat 9.

First, the detection unit 24 determines whether the total capacitance $C_t$ exceeds the first threshold $Th_1$ at S121. The total capacitance $C_t$ is a total of the outputs from the first sensor part 101, the second sensor part 102, the third sensor unit 103, and the fourth sensor unit 104 (i.e., a total of the first, second, third, fourth capacitances $C_1, C_2, C_3, C_4$, which are respectively outputted from the first, second, third and fourth sensor parts 101 to 104).

When the total capacitance $C_t$ exceeds the first threshold $Th_1$ at S121, the detection unit 24, at S122, determines that the occupant type is an adult.

On the other hand, when the total capacitance $C_t$ does not exceed the first threshold $Th_1$ at S121, the detection unit 24 determines whether a right-side capacitance $C_{12}$, which is a total of the first capacitance $C_1$ and second capacitance $C_2$, is equal to or greater than a seventh threshold $Th_7$, which is predetermined. Here, the seventh threshold $Th_7$ is a threshold for determining the posture and the occupant type as an adult in a right-sideway sitting posture based on the right-side capacitance $C_{12}$.

When the right-side capacitance $C_{12}$ is equal to or greater than the seventh threshold $Th_7$ at S123, the outputs of the first and second sensor parts 101, 102, which are on the right side of the seat 9, are great, and the detection unit 24 determines that the occupant type is an adult in a right-sideway sitting posture at S124.

On the other hand, when the right-side capacitance $C_{12}$ is not equal to or greater than the seventh threshold $Th_7$ at S123, the detection unit 24 determines, at S125, whether a left-side capacitance $C_{34}$, which is a total of the third capacitance $C_3$ and fourth capacitance $C_4$, is equal to or greater than a eighth threshold $Th_8$, which is predetermined. Here, the eighth threshold $Th_8$ is a threshold for determining the posture and the occupant type as an adult in a left-sideway sitting posture based on the left-side capacitance $C_{34}$.

When the left-side capacitance $C_{34}$ is equal to or greater than the eighth threshold $Th_8$ at S125, the outputs of the third and fourth sensor parts 103, 104, which are on the left side of the seat 9, are great, and, the detection unit 24 determines that the occupant type is an adult in a left-sideway sitting posture.

On the other hand, when the left-side capacitance $C_{34}$ is not equal to or greater than the eighth threshold $Th_8$ at S125, the detection unit 24 determines that the occupant type is a child (CRS) at S127.

According to the present embodiment, even when the total capacitance $C_t$ is small, the occupant sensor device can detect and determine that an occupant type is an adult with one's posture changed (i.e., in a right-sideway sitting or in a left-sideway sitting) without mis-determining that an occupant type is a child (CRS) if the output of the right-side or left-side sensor part is great. In particular, if the right-side capacitance $C_{12}$, which is an output of the right-side sensors, or the left-side capacitance $C_{34}$, which is an output of the left-side sensors, is greater than a respective threshold then an adult is detected.

In addition, based on a total of the output from the first sensor part 101 and the third sensor part 103, or a total of the output from the second sensor part 102 and the fourth sensor part 104, an adult in a front-side sitting posture or an adult in a deep sitting posture may also be detected and determined.

Further, an order for performing S123, S124 and an order for performing S125, S126 may be exchanged, or may simultaneously be performed.

Based on the third embodiment, the seventh threshold $Th_7$ and the eighth threshold $Th_8$ may be referred to as a partial threshold in the claims.

Fourth Embodiment

Figure 9:
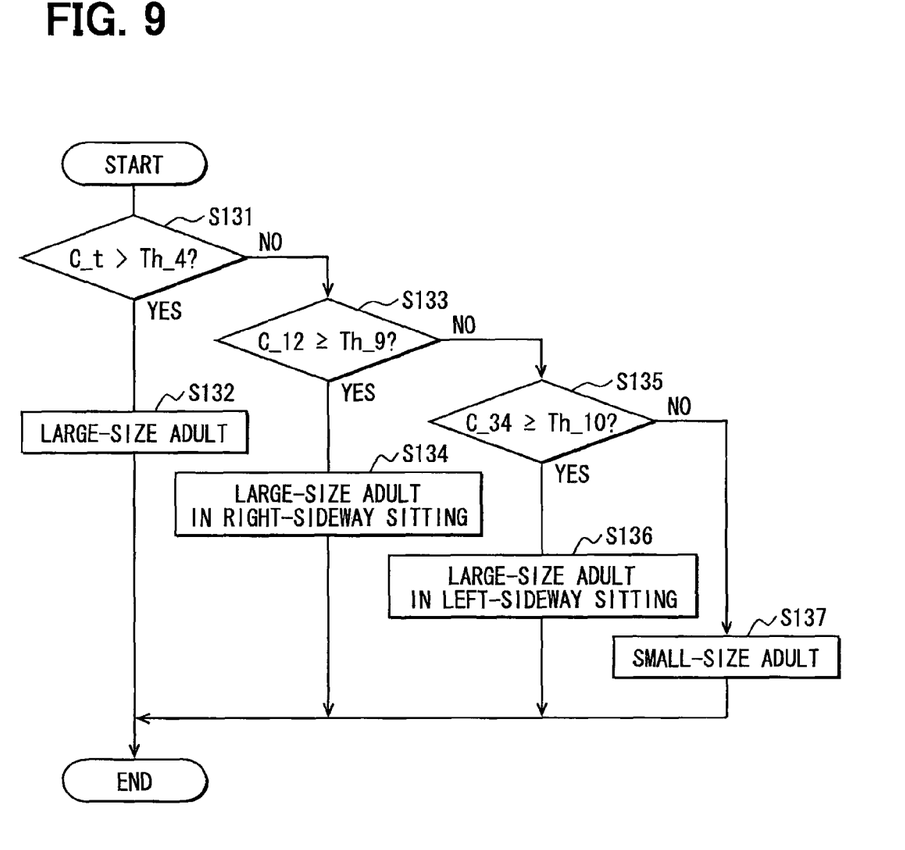
FIG. 9 is a flowchart of an occupant size-determination process performed by the detection unit in a fourth embodiment of the present disclosure.

With reference to FIG. 9, an occupant size-determination process is shown in a fourth embodiment. The fourth embodiment differs from the third embodiment in that the detection unit 24 determines whether a large-size adult or a small-size adult is sitting in the seat 9. The following description is about a process after the determination that an occupant is an adult.

The detection unit 24 determines whether the total capacitance $C_t$ exceeds the fourth threshold $Th_4$ at S131. When the total capacitance $C_t$ exceeds the fourth threshold $Th_4$ at S131, the detection unit 24 determines that the occupant type is a large-size adult.

On the other hand, when the total capacitance $C_t$ does not exceed the fourth threshold $Th_4$ at S131, the detection unit 24 determines whether the right side capacitance $C_{12}$ is equal to or greater than a ninth threshold $Th_9$, which is predetermined, at S133. Here, the ninth threshold $Th_9$ is a threshold for determining the posture and the type of the occupant as a large-size adult in a right-sideway sitting posture based on the right-side capacitance $C_{12}$.

When the right-side capacitance $C_{12}$ is equal to or greater than the ninth threshold $Th_9$ at S133, the outputs of the first sensor part 101 and the second sensor part 102 on the vehicle right side of the seat 9 are great, and the detection unit 24 determines that the occupant type is a large-size adult in a right-sideway sitting posture at S134.

On the other hand, when the right side capacitance $C_{12}$ is not equal to or greater than the ninth threshold $Th_9$ at S133, the detection unit 24 determines whether the left-side capacitance $C_{34}$ is equal to or greater than a tenth threshold $Th_{10}$, which is predetermined, at S135. Here, the tenth threshold Th_10 is a threshold for determining the posture and the type of the occupant as a large-size adult in a left-sideway sitting posture based on the left-side capacitance C_34.

When the left capacitance C_34 is equal to or greater than the tenth threshold Th_10 at S135, the outputs of the third sensor part 103 and the fourth sensor part 104 on the vehicle left side of the seat 9 are great, and the detection unit 24 determines that the occupant type is a large-size adult in a left-sideway sitting posture at S136.

On the other hand, when the left capacitance C_34 is not equal to or greater than the tenth threshold Th_10 at S135, the detection unit 24 determines that the occupant type is a small-size adult at S137

According to the present embodiment, even when the total capacitance C_t is small, the occupant sensor device can detect and determine that an occupant type is a large-size adult with one's posture changed, (i.e., in a right-sideway sitting posture or in a left-sideway sitting posture) without mis-determining that the occupant type is a small-size adult if the output of the right-side or left-side sensor part is great. In particular, if the right-side capacitance C_12, which is a total output of the sensors on the right side of the seat 9, or the left-side capacitance C_34, which is a total output of the sensors on the left side of the seat 9, is greater than a respective threshold then a large-size adult is detected as sitting in the seat 9.

Further, an order of performing S133, S134 and an order of performing S135, S136 may be exchanged, or may simultaneously be performed.

Based on the fourth embodiment, the ninth threshold Th_9 and the tenth threshold Th_10 may be referred to as a partial threshold in the claims.

Based on the embodiments described above, the sensor body unit 1 is divided into at least two parts that can be respectively configured to have separate bodies (e.g., two bodies in total) to make up the sensor body unit 1. Also, the sensor body unit may be configured to have its parts enclosed in one united body (i.e., the sensor body unit 1 having one body), in which, for example, a part of the sensor body unit 1 is used as the first sensor part 101 and the other part of the sensor body unit 1 is used as the second sensor part 102.

Other Embodiments

Although the present disclosure has been fully described in connection with the preferred embodiment thereof with reference to the accompanying drawings, it is to be noted that various changes and modifications will become apparent to those skilled in the art.

For instance, the detection unit 24 disposed in the occupant detection ECU 2 in the above embodiments may be disposed in another ECU, such as an airbag ECU. The occupant detection ECU 2 is connected to the airbag ECU, and determines permission/prohibition of a deployment of the airbag based on the occupant determination.

The division of the sensor body unit 1 into two parts or four parts in the above embodiments may also be changed. That is, the sensor body unit 1 may be divided into three parts, or may be divided into five parts or more.

Such changes and modifications are to be understood as being within the scope of the present disclosure as defined by the appended claims.

What is claimed is:

1. An occupant sensor device disposed in a vehicle comprising:
   a sensor body disposed in a base part of a seat, wherein the sensor body is divided into at least two parts along at least one of two axes, such that a first sensor part of the sensor body is positioned in front of a second sensor part; and
   an occupant detector detecting an occupant position posture and an occupant type of an occupant seated on the seat based on a capacitance between the sensor body and a vehicle body, wherein
   the occupant detector detects the occupant position posture and the occupant type based on a first capacitance, a second capacitance, and a total capacitance, which is a total of the first capacitance and the second capacitance, the first capacitance is a capacitance between the first sensor part and the vehicle body, and the second capacitance is a capacitance between the second sensor part and the vehicle body,
   the sensor body is divided into four parts, such that the first sensor part has a first-right sensor part and a first-left sensor part, the second sensor part has a second-right sensor part and a second-left sensor part, which are respectively behind the first-right sensor part and the first-left sensor part, the first-right sensor part and the second-right sensor part form a right sensor part of the sensor body and the first-left sensor part and the second-left sensor part form a left sensor part of the sensor body, and
   the occupant detector detects the occupant position posture and the occupant type based on a right-side capacitance, a left-side capacitance, and the total capacitance, the right-side capacitance is a capacitance between the right sensor part and the vehicle body, and the left-side capacitance is a capacitance between the left sensor part and the vehicle body.

2. The occupant sensor device of claim 1, wherein
   the occupant detector has a total threshold for determining the occupant position posture and the occupant type based on the total capacitance, and a partial threshold for determining the occupant position posture and the occupant type based on at least one of the right-side capacitance and the left-side capacitance that is detected by the sensor body,
   the occupant type is determined as an adult when the total capacitance is greater than or equal to the total threshold or when the total capacitance is less than the total threshold and at least one of the right-side capacitance or the left-side capacitance is greater than or equal to the partial threshold, and
   the occupant type is determined as a child when the total capacitance is smaller than the total threshold and when the right-side capacitance and the left-side capacitance are less than the partial threshold.

3. The occupant sensor device of claim 1, wherein
   the occupant detector has a total threshold for determining the occupant position posture and the occupant type based on the total capacitance and a partial threshold for determining the occupant position posture and the occupant type based on at least one of the right-side capacitance and the left-side capacitance that is detected by the sensor body,
   the occupant type is determined as a large-size adult when the total capacitance is greater than or equal to the total threshold or when the total capacitance is less than the total threshold and at least one of the right-side capacitance or the left-side capacitance is greater than or equal to the partial threshold, and
   the occupant type is determined as a small-size adult when the total capacitance is less than the total threshold and when the right-side capacitance and left-side capacitance are less than the partial threshold.

4. The occupant sensor device of claim 1, wherein
the occupant position posture detected by the occupant detector includes at least one of a front-side sitting posture, a right-side sitting posture, or a left-side sitting posture.

5. The occupant sensor device of claim 4, wherein
the occupant detector has a total threshold for determining the occupant position posture and the occupant type based on the total capacitance, and a partial threshold for determining the occupant position posture and the occupant type based on at least one of the first capacitance and the second capacitance,
the occupant type is determined as an adult when the total capacitance is greater than or equal to the total threshold or when the total capacitance is less than the total threshold and at least one of the right-side capacitance or the left-side capacitance is greater than or equal to the partial threshold,
the occupant position posture is determined as the right-side sitting posture when the right-side capacitance is greater than or equal to the partial threshold, and
the occupant position posture is determined as the left-side sitting posture when the left-side capacitance is greater than or equal to the partial threshold, and
the occupant type is determined as a child when the total capacitance is less than the total threshold and when the right-side capacitance and left-side capacitance are less than the partial threshold.

6. The occupant sensor device of claim 4, wherein
the occupant detector has a total threshold for determining the occupant position posture and the occupant type based on the total capacitance, and a partial threshold for determining the occupant position posture and the occupant type based on at least one of the first capacitance and the second capacitance,
the occupant type is determined as a large-size adult when the total capacitance is greater than or equal to the total threshold or when the total capacitance is less than the total threshold and at least one of the right-side capacitance or the left-side capacitance is greater than or equal to the partial threshold,
the occupant position posture is determined as the right-side sitting posture when the right-side capacitance is greater than or equal to the partial threshold, and
the occupant position posture is determined as the left-side sitting posture when the left-side capacitance is greater than or equal to the partial threshold, and
the occupant type is determined as a small-size adult when the total capacitance is less than the total threshold and when the right-side capacitance and left-side capacitance are less than the partial threshold.

7. An occupant sensor device disposed in a vehicle comprising:
a sensor body disposed in a base part of a seat, wherein the sensor body is divided into at least two parts along an axis that is parallel to a longitudinal direction of the vehicle, such that a first sensor part of the sensor body is positioned side-by-side with a second sensor part; and
an occupant detector detecting an occupant position posture and an occupant type of an occupant seated on the seat based on a capacitance between the sensor body and a vehicle body, wherein the occupant detector detects the occupant position posture and the occupant type based on a first capacitance, a second capacitance, and a total capacitance, which is a total of the first capacitance and the second capacitance, the first capacitance is a capacitance between the first sensor part and the vehicle body, and the second capacitance is a capacitance between the second sensor part and the vehicle body,
the sensor body is divided into four parts, such that the first sensor part has a first-right sensor part and a first-left sensor part, the second sensor part has a second-right sensor part and a second-left sensor part, which are respectively behind the first-right sensor part and the first-left sensor part, the first-right sensor part and the second-right sensor part form a right sensor part of the sensor body and the first-left sensor part and the second-left sensor part form a left sensor part of the sensor body, and
the occupant detector detects the occupant position posture and the occupant type based on a right-side capacitance, a left-side capacitance, and the total capacitance, the right-side capacitance is a capacitance between the right sensor part and the vehicle body, and the left-side capacitance is a capacitance between the left sensor part and the vehicle body.

8. The occupant sensor device of claim 7, wherein
the occupant detector has a total threshold for determining the occupant position posture and the occupant type based on the total capacitance, and a partial threshold for determining the occupant position posture and the occupant type based on at least one of the right-side capacitance and the left-side capacitance that is detected by the sensor body,
the occupant type is determined as an adult when the total capacitance is greater than or equal to the total threshold or when the total capacitance is less than the total threshold and at least one of the right-side capacitance or the left-side capacitance is greater than or equal to the partial threshold, and
the occupant type is determined as a child when the total capacitance is smaller than the total threshold and when the right-side capacitance and the left-side capacitance are less than the partial threshold.

9. The occupant sensor device of claim 7, wherein
the occupant detector has a total threshold for determining the occupant position posture and the occupant type based on the total capacitance, and a partial threshold for determining the occupant position posture and the occupant type based on at least one of the right-side capacitance and the left-side capacitance that is detected by the sensor body,
the occupant type is determined as a large-size adult when the total capacitance is greater than or equal to the total threshold or when the total capacitance is less than the total threshold and at least one of the right-side capacitance or the left-side capacitance is greater than or equal to the partial threshold, and
the occupant type is determined as a small-size adult when the total capacitance is less than the total threshold and when the right-side capacitance and left-side capacitance are less than the partial threshold.

* * * * *